US009120127B2

(12) United States Patent
Jeong et al.

(10) Patent No.: US 9,120,127 B2
(45) Date of Patent: Sep. 1, 2015

(54) ULTRASONIC TRANSDUCER STRUCTURE, ULTRASONIC TRANSDUCER, AND METHOD OF MANUFACTURING ULTRASONIC TRANSDUCER

(75) Inventors: Byung-gil Jeong, Anyang-si (KR); Seog-woo Hong, Yongin-si (KR); Dong-kyun Kim, Suwon-si (KR); Seok-whan Chung, Hwaseong-si (KR); Hyung-jae Shin, Seongnam-si (KR)

(73) Assignee: SAMSUNG ELECTRONICS CO., LTD., Suwon Si (KR)

( * ) Notice: Subject to any disclaimer, the term of this patent is extended or adjusted under 35 U.S.C. 154(b) by 329 days.

(21) Appl. No.: 13/616,285

(22) Filed: Sep. 14, 2012

(65) Prior Publication Data

US 2013/0169110 A1 Jul. 4, 2013

(30) Foreign Application Priority Data

Dec. 28, 2011 (KR) ........................ 10-2011-0145157

(51) Int. Cl.
*H01L 41/053* (2006.01)
*B06B 1/02* (2006.01)

(52) U.S. Cl.
CPC ......... *B06B 1/0292* (2013.01); *Y10T 29/49005* (2015.01)

(58) Field of Classification Search
CPC .. B81B 3/0027; B06B 1/0292; B06B 1/0207; B06B 1/02; B81C 1/00158
USPC ................. 310/300, 309, 314, 334, 336, 311; 257/416, 417; 600/459; 73/627, 623
See application file for complete search history.

(56) References Cited

U.S. PATENT DOCUMENTS

| | | | | |
|---|---|---|---|---|
| 6,441,481 | B1 * | 8/2002 | Karpman | 257/711 |
| 7,846,102 | B2 * | 12/2010 | Kupnik et al. | 310/309 |
| 2008/0048211 | A1 * | 2/2008 | Khuri-Yakub et al. | 257/204 |
| 2008/0296708 | A1 | 12/2008 | Wodnicki et al. | |
| 2009/0140357 | A1 * | 6/2009 | Kupnik et al. | 257/416 |

FOREIGN PATENT DOCUMENTS

JP 2007-229328 A 9/2007

* cited by examiner

*Primary Examiner* — Thomas Dougherty
*Assistant Examiner* — Karen B Addison
(74) *Attorney, Agent, or Firm* — Sughrue Mion, PLLC

(57) ABSTRACT

An ultrasonic transducer structure, an ultrasonic transducer, and a method of manufacturing the ultrasonic transducer are provided. The ultrasonic transducer structure includes a driving wafer that includes a driving circuit; and an ultrasonic transducer wafer that is disposed on the driving wafer and includes a first wafer in which a via-hole is formed, a first insulating layer formed on the first wafer, a second wafer spaced apart from the first insulating layer, and a cavity formed between the first insulating layer and the second wafer.

6 Claims, 4 Drawing Sheets

ULTRASONIC TRANSDUCER STRUCTURE, ULTRASONIC TRANSDUCER, AND METHOD OF MANUFACTURING ULTRASONIC TRANSDUCER

CROSS-REFERENCE TO RELATED APPLICATIONS

This application claims priority from Korean Patent Application No. 10-2011-0145157, filed on Dec. 28, 2011, in the Korean Intellectual Property Office, the disclosure of which is incorporated by reference herein in its entirety.

BACKGROUND

1. Field

The present disclosure relates to ultrasonic transducer structures, ultrasonic transducers, and methods of manufacturing the ultrasonic transducers.

2. Description of the Related Art

Ultrasonic transducers such as micromachined ultrasonic transducers (MUTs) convert an electrical signal into an ultrasonic signal or convert an ultrasonic signal into an electrical signal. MUTs may be applied to, for example, medical image diagnostic devices to obtain images of tissues or organs of human bodies non-invasively. MUTs may be classified into piezoelectric micromachined ultrasonic transducers (pMUTs), capacitive micromachined ultrasonic transducers (cMUTs), and magnetic micromachined ultrasonic transducers (mMUTs) according to their transduction methods. From among the MUTs, the cMUTs are widely used.

SUMMARY

One or more embodiments provide an ultrasonic transducer having a simple structure.

One or more embodiments also provide a method for simplifying the manufacture of an ultrasonic transducer.

According to an aspect of an embodiment, there is provided an ultrasonic transducer structure including: a driving wafer that includes a driving circuit; and an ultrasonic transducer wafer that is disposed on the driving wafer, and that includes a first wafer in which a via-hole is formed, a first insulating layer formed on the first wafer, a second wafer spaced apart from the first insulating layer, and a cavity formed between the first insulating layer and the second wafer.

The driving wafer may be an application-specific integrated circuit (ASIC) wafer.

The first wafer may be a low-resistivity silicon wafer.

The second wafer may be a silicon wafer.

The second wafer may be a silicon-on-insulator (SOI) wafer.

The ultrasonic transducer wafer may be directly bonded to the driving wafer.

The driving wafer and the ultrasonic transducer wafer may be bonded to each other by using eutectic bonding or polymer bonding.

Each of the driving wafer and the ultrasonic transducer wafer may include a plurality of connecting portions, and each of the plurality of connecting portions is formed of at least one material selected from the group consisting of gold (Au), copper (Cu), stannum (Sn), silver (Ag), aluminum (Al), platinum (Pt), titanium (Ti), nickel (Ni), and chromium (Cr).

According to an aspect of another embodiment, there is provided an ultrasonic transducer including: a first substrate that includes a driving circuit; a first insulating layer that is disposed on the first substrate; a second substrate that is disposed on the first insulating layer and that has a via-hole formed therein; a support portion that is disposed above the second substrate to be spaced apart from the second substrate; a thin film that is supported by the support portion and is spaced apart from the second substrate; and a cavity that is formed between the second substrate and the thin film, wherein the first substrate and the second substrate are directly bonded to each other with the first insulating layer therebetween.

The first substrate may be an ASIC substrate.

The second substrate may be a low-resistivity silicon substrate.

The third substrate may be a silicon substrate.

The first substrate and the second substrate may be bonded to each other by using eutectic bonding or polymer bonding.

According to an aspect of another embodiment, there is provided a method of manufacturing an ultrasonic transducer, the method including: depositing a first insulating layer on a first wafer; forming a gap by patterning the first insulating layer; depositing a second insulating layer on a second wafer; bonding the first wafer to the second wafer such that the first insulating layer and the second insulating layer face each other; forming a via-hole in the second wafer; depositing a third insulating layer on an exposed surface of the second wafer; forming a metal layer on the third insulating layer; forming a first connecting portion and a second connecting portion by patterning the metal layer; preparing a third wafer that includes a driving circuit, and a third connecting portion and a fourth connecting portion respectively corresponding to the first connecting portion and the second connecting portion; and bonding the third wafer to the second wafer.

The first wafer may be an SOI wafer that includes a first silicon layer, an insulating layer, and a second silicon layer.

The method may further include, after the bonding of the third wafer to the second wafer, removing the insulating layer and the second silicon layer of the SOI wafer.

The first insulating layer may be formed of SiO2.

The second wafer may be a low-resistivity silicon wafer.

The method may further include, before the forming of the via-hole, polishing the second wafer.

The bonding of the first wafer to the second wafer may include bonding the first wafer to the second wafer by using silicon direct bonding.

The bonding of the third wafer to the second wafer may include the bonding of the third wafer to the second wafer by using eutectic bonding or polymer bonding.

The third wafer may be an ASIC wafer.

The method may further include, after the first wafer, the second wafer, and the third wafer are bonded to each other to form a wafer structure, slicing the wafer structure in units of chips to produce ultrasonic transducers.

BRIEF DESCRIPTION OF THE DRAWINGS

The above and/or other aspects will become apparent and more readily appreciated from the following description of embodiments, taken in conjunction with the accompanying drawings of which.

DETAILED DESCRIPTION

Figure 1:
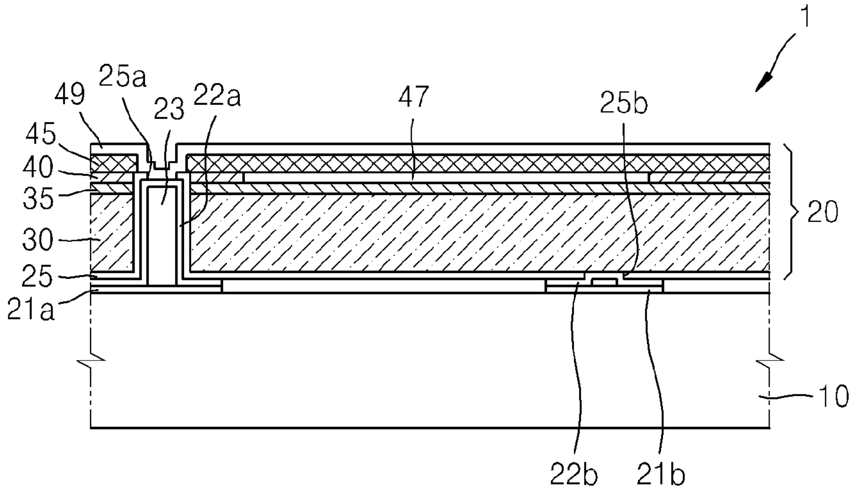
FIG. 1 is a cross-sectional view illustrating an ultrasonic transducer structure according to an embodiment.

The present inventive concept will now be described more fully with reference to the accompanying drawings, in which exemplary embodiments are shown. In the drawings, the same reference numerals denote the same elements and the thicknesses of layers and regions and the sizes of components may be exaggerated for clarity. The present inventive concept may be embodied in different forms and should not be construed as limited to the exemplary embodiments set forth herein. For example, it will also be understood that when a layer is referred to as being "on" another layer or a substrate, it can be directly on the other layer or the substrate, or intervening layers may also be present therebetween.

FIG. 1 is a cross-sectional view illustrating an ultrasonic transducer structure according to an embodiment. As shown in FIG. 1, an ultrasonic transducer structure 1 may include a driving wafer 10 and an ultrasonic transducer wafer 20 bonded to the driving wafer 10. The ultrasonic transducer wafer 20 may be mounted on the driving wafer 10. The driving wafer 10 and the ultrasonic transducer wafer 20 may be bonded to each other by using eutectic bonding or polymer bonding using a conductive polymer. For example, the ultrasonic transducer wafer 20 may be bonded to the driving wafer 10 to directly contact the driving wafer 10.

The driving wafer 10 may be, for example, an application-specific integrated circuit (ASIC) wafer. For example, the driving wafer 10 may include circuit elements such as a high voltage (HV) pulser, a preamplifier, and/or a transistor switch.

The ultrasonic transducer wafer 20 may include a first wafer 30, and a second wafer 45 that faces the first wafer 30 and is spaced apart from the first wafer 30. The second wafer 45 may be supported above the first wafer 30 by a support portion 40, and a first insulating layer 35 may be disposed on the first wafer 30. A cavity 47 may be formed between the first insulating layer 35 and the second wafer 45. A thickness of the cavity 47 may be determined by the support portion 40. The cavity 47 may be kept under vacuum.

The first wafer 30 may be formed of a conductive material, for example, silicon, and a thickness of the first wafer 30 may be tens of micrometers (μm). For example, a thickness of the first wafer 30 may range from about 10 μm to about 90 μm, and preferably, may range from about 10 μm to about 50 μm. The first wafer 30 may be formed of low-resistivity silicon. For example, the first wafer 30 may be heavily doped to have a low resistivity. The first wafer 30 doped to have a low resistivity may be used as a lower electrode.

The second wafer 45 may be a thin film, and an electrode layer 49 may be formed on the second wafer 45. The electrode layer 49 may be used as an upper electrode. The electrode layer 49 may be formed of a conductive material, such as gold (Au), copper (Cu), stannum (Sn), silver (Ag), aluminum (Al), platinum (Pt), titanium (Ti), nickel (Ni), chromium (Cr), or a combination thereof.

The support portion 40 that supports the second wafer 45 may be formed of an insulating material. The support portion 40 may include, for example, a nitride or an oxide such as silicon oxide. The first insulating layer 35 may include, for example, an oxide or a nitride such as silicon nitride. The first insulating layer 35 may prevent the first wafer 30 used as a lower electrode and the electrode layer 49 used as an upper electrode from being short-circuited to each other.

A via-hole 23 may be formed in the first wafer 30. A second insulating layer 25 may be disposed under the first wafer 30. At least one through-hole may be formed in the second insulating layer 25. For example, a first through-hole **25*a* may be formed over the via-hole 23 to be connected to the electrode layer 49, and a second through-hole 25*b* may be formed to be connected to the first wafer 30**.

A first connecting portion **22*a* for electrically connecting the electrode layer 49 and the driving wafer 10 through the first through-hole 25*a* may be disposed along the via-hole 23 and a second connecting portion 22*b* for electrically connecting the first wafer 30 and the driving wafer 10 may be disposed in the second through-hole 25*b*. A third connecting portion 21*a* corresponding to the first connecting portion 22*a* and a fourth connecting portion 21*b* corresponding to the second connecting portion 22*b* may be disposed on the driving wafer 10. The first connecting portion 22*a*, the second connecting portion 22*b*, the third connecting portion 21*a*, and the fourth connecting portion 21*b* may be used as electrode pads. Each of the first connecting portion 22*a*, the second connecting portion 22*b*, the third connecting portion 21*a*, and the fourth connecting portion 21*b* may be formed of a metal for eutectic bonding, for example, Au, Cu, Sn, Ag, Al, Pt, Ti, Ni, Cr, or a combination thereof. Alternatively, the first connecting portion 22*a*, the second connecting portion 22*b*, the third connecting portion 21*a*, and the fourth connecting portion 21*b* may be formed of a conductive polymer and may be bonded by using polymer bonding. The via-hole 23** may be filled with a conductive material such as Au, Cu, Sn, Ag, Al, Pt, Ti, Ni, Cr, or a combination thereof.

An ultrasonic transducer may be obtained by slicing an ultrasonic transducer structure, e.g., the ultrasonic transducer structure 1 of FIG. 1, in units of chips. In other words, an ultrasonic transducer structure having many chips is formed on a wafer on wafer basis, and then sliced in order to produce individual ultrasonic transducers.

Figure 2:
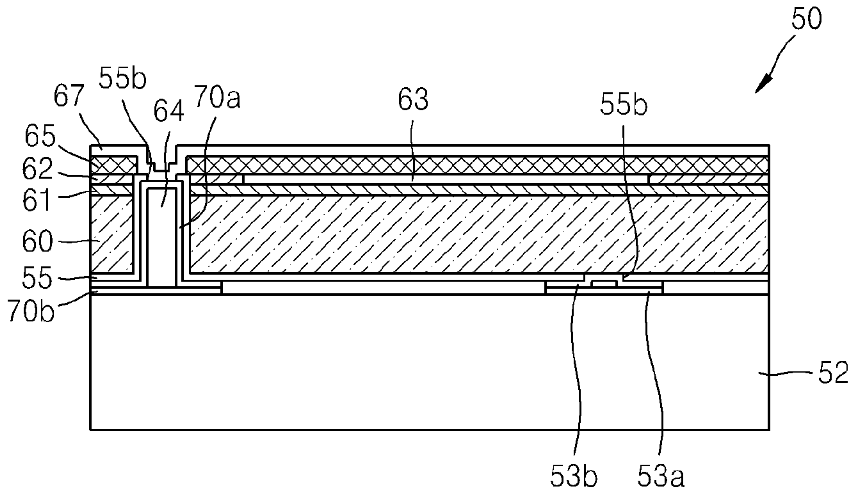
FIG. 2 is a cross-sectional view illustrating an ultrasonic transducer according to an embodiment.

FIG. 2 is a cross-sectional view illustrating an ultrasonic transducer obtained by slicing an ultrasonic transducer structure in units of chips, according to an embodiment.

As shown in FIG. 2, an ultrasonic transducer 50 may include a first substrate 52 that includes a driving circuit, a second substrate 60 that is disposed on the first substrate 52, and a thin film 65 that is spaced apart from the second substrate 60 and is supported by a support portion 62. The support portion 62 may be formed of an insulating material. For example, the support portion 62 may be formed of a nitride or an oxide, for example, SiO2.

The second substrate 60 may be formed of a conductive material, for example, silicon. The second substrate 60 may be formed of low-resistivity silicon, and may be heavily doped to have a low resistivity. The second substrate 60 doped to have a low resistivity may be used as a lower electrode. An electrode layer 67 used as an upper electrode may be formed on the thin film 65. A via-hole 64 may be formed in the second substrate 60 to pass through the second substrate 60.

A first insulating layer 55 may be disposed between the first substrate 52 and the second substrate 60. The first insulating layer 55 may be disposed along a bottom surface of the second substrate 60 and the via-hole 64. The first substrate 52, the first insulating layer 55, and the second substrate 60 may be sequentially stacked without intermediate layers therebetween. In order to electrically connect the first substrate 52 and the second substrate 60, a first connecting portion **53*a* contacting the first substrate 52 and a second connecting portion 53*b* contacting the second substrate 60 may be provided. The second connecting portion 53*b* may be disposed in a first through-hole 55*a* formed in the first insulating layer 55 to contact the second substrate 60. The second connecting portion 53*b* may contact the first connecting portion 53*a*. A second insulating layer 61 may be disposed on the second substrate 60. Each of the first insulating layer 55 and the second insulating layer 61 may be formed of a nitride or an oxide, for example, SiO2. A cavity 63 may be formed between the second insulating layer 61 and the thin film 65, and a thickness of the cavity 63 may be determined by a thickness of the support portion 62**.

A third connecting portion 70*a* may be disposed along the via-hole 64, and may extend to a bottom surface of the first insulating layer 55. A second through-hole 55*b* may be formed in the first insulating layer 55 disposed along the via-hole 64. The third connecting portion 70*a* and the electrode layer 67 may be electrically connected to each other through the second through-hole 55*b*. A fourth connecting portion 70*b* is disposed on the first substrate 52. The fourth connecting portion 70*b* may be bonded to the third connecting portion 70*a*.

Each of the first connecting portion 53*a*, the second connecting portion 53*b*, the third connecting portion 70*a*, and the fourth connecting portion 70*b* may be formed of a metal for eutectic bonding, for example, Au, Cu, Sn, Ag, Al, Ot, Ti, Ni, Cr, or a combination thereof. Alternatively, each of the first connecting portion 53*a*, the second connecting portion 53*b*, the third connecting portion 70*a*, and the fourth connecting portion 70*b* may be formed of a conductive polymer. The electrode layer 67 may be formed of a conductive material, for example, Au, Cu, Sn, Ag, Al, Ot, Ti, Ni, Cr, or a combination thereof. Each of the first insulating layer 55 and the second insulating layer 61 may be formed of an oxide or a nitride, for example, silicon oxide or silicon nitride. Meanwhile, the via-hole 64 may be filled with a conductive material such Au, Cu, Sn, Ag, Al, Pt, Ti, Ni, Cr, or a combination thereof.

An operation of the ultrasonic transducer 50 of FIG. 2 will be explained below. First, a transmission operation of the ultrasonic transducer 50 will be explained. When a first direct current (DC) voltage (not shown) is applied to the second electrode 60 used as a lower electrode and the electrode layer 67 used as an upper electrode, the thin film 65 may be located at a height where a gravity applied to the thin film 65 and an electrostatic force between the second substrate 60 and the electrode layer 67 are equal to each other. In this state, when an alternating current (AC) voltage is applied to the second substrate 60 and the electrode layer 67, the thin film 65 may be vibrated due to a change in the electrostatic force between the second substrate 60 and the electrode layer 67. Due to the vibration, an ultrasonic signal may be transmitted form the thin film 65.

Next, a reception operation of the ultrasonic transducer 50 will be explained. When a second DC voltage (not shown) is applied to the second substrate 60 and the electrode layer 67, the thin film 65 may be located at a height where a gravity applied to the thin film 65 and an electrostatic force between the second substrate 60 and the electrode layer 67 are equal to each other. In this state, when an external physical signal, for example, an acoustic signal, is input to the thin film 65, the electrostatic force between the second substrate 60 and the electrode layer 67 may be changed. The acoustic signal may be received by detecting the changed electrostatic force. The first DC voltage may be the same as or different from the second DC voltage.

Since the first substrate 52 and the second substrate 60 are directly connected to each other through connecting portions to minimize a path through which an electrical signal travels, a parasitic component is reduced and thus a reception sensitivity of the ultrasonic transducer 50 may be improved. Also, since the number of the connecting portions between the first substrate 52 and the second substrate 60 is small, the reliability of the ultrasonic transducer 50 under long-term operation may be improved.

FIGS. 3A through 3F are cross-sectional view for explaining a method of manufacturing an ultrasonic transducer, according to an embodiment.

Figure 3A:
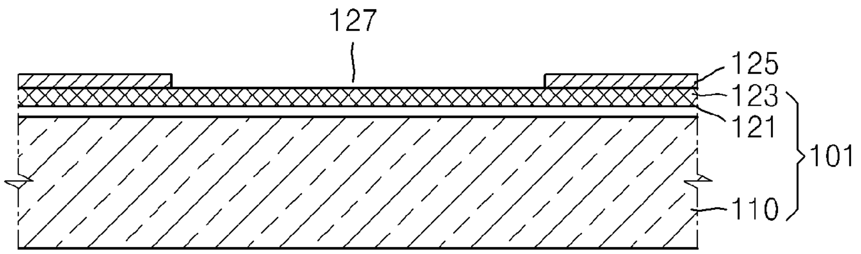
FIGS. 3A through 3F are cross-sectional views illustrating a method of manufacturing an ultrasonic transducer, according to an embodiment.

Referring to FIG. 3A, a first insulating layer 125 is deposited on a first wafer 101, and a gap 127 is formed by patterning the first insulating layer 125. The first insulating layer 125 may be formed of, for example, an oxide or a nitride. The oxide may be, for example, SiO2. A portion of the first insulating layer 125 remaining after the patterning may be used as a support portion, and a thickness of the gap 127 may be defined by a thickness of the first insulating layer 125. The first wafer 101 may be, for example, a silicon-on-insulator (SOI) wafer. The first wafer 101 may include a first silicon layer 110, an insulating layer 121, and a second silicon layer 123.

Figure 3B:
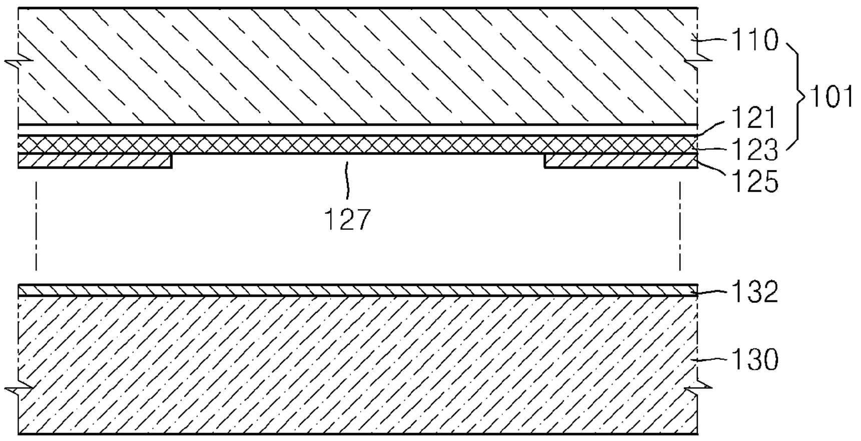
Figure 3C:
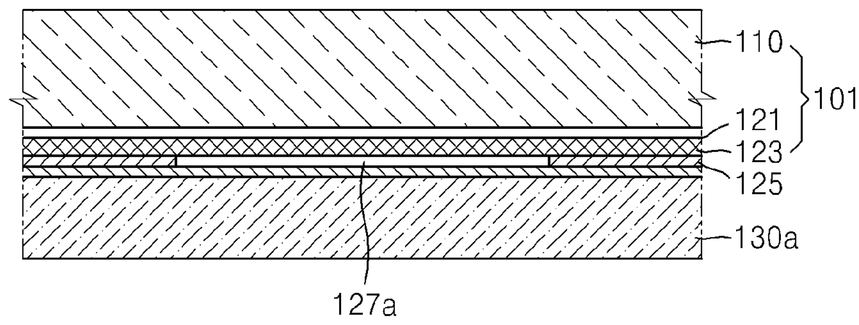

Referring to FIG. 3B, a second insulating layer 132 may be deposited on a second wafer 130, a resultant structure illustrated in FIG. 3A may be overturned such that the first insulating layer 125 and the second insulating layer 132 face each other, and the first insulating layer 125 and the second insulating layer 132 may be bonded to each other. The second wafer 130 may be formed of a conductive material and may be used as a lower electrode. The second wafer 130 may be formed of, for example, low-resistivity silicon, to be used as an electrode. Referring to FIG. 3C, the first wafer 101 and the second wafer 130 may be bonded to each other in a wafer-to-wafer manner by using silicon direct bonding (SDB). As the first wafer 101 and the second wafer 130 are bonded to each other, the gap 127 may become a cavity 127*a*.

Figure 3D:
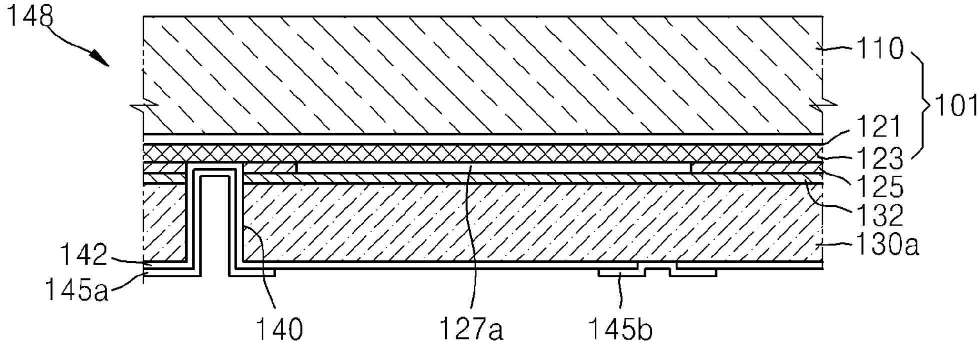

Referring to FIG. 3C, in order to electrically connect the second wafer 130, the second wafer 130 may be polished to obtain a second wafer 130*a* having a reduced thickness. A via-hole 140 is formed in the second wafer 130*a* having reduced the thickness. Referring to FIG. 3D, the via-hole 140 may pass through up to the second silicon layer 123. Next, a third insulating layer 142 is deposited on the second wafer 130*a* having the reduced thickness. A first connecting portion 145*a* and a second connecting portion 145*b* may be formed by depositing a metal layer on the third insulating layer 142 and performing patterning. As a result, an ultrasonic transducer wafer 148 may be completely formed as shown in FIG. 3D.

Figure 3E:
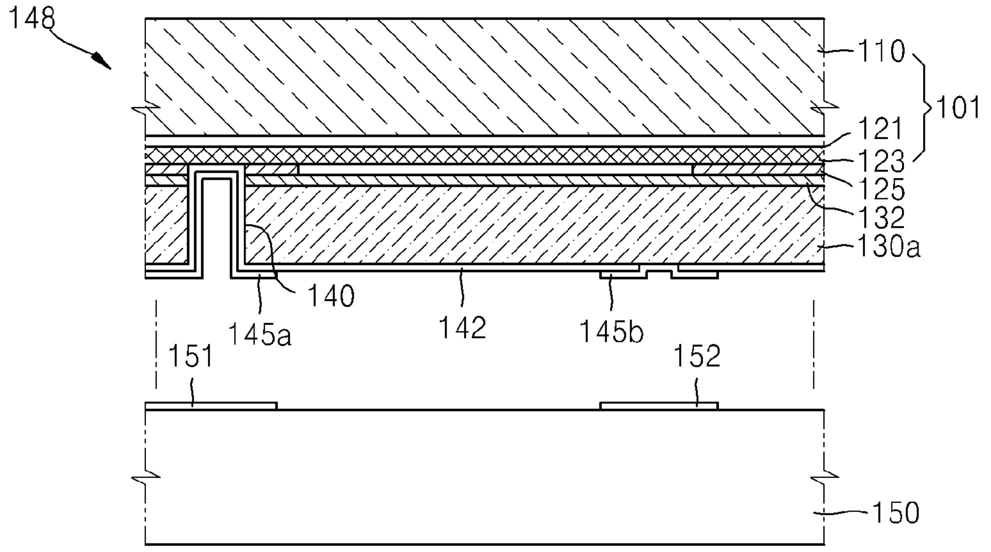

Referring to FIG. 3E, a third wafer 150 may be prepared. The third wafer 150 including a driving circuit may be, for example, an ASIC wafer. A method of manufacturing a wafer including a driving circuit is known and thus a detailed explanation thereof will not be given. A third connecting portion 151 and a fourth connecting portion 152 may be formed on the third wafer 150. Each of the first connecting portion 145*a*, the second connecting portion 145*b*, the third connecting portion 151, and the fourth connecting portion 152 may be formed of a metal for eutectic bonding, for example, Au, Cu, Sn, Ag, Al, Pt, Ti, Ni, Cr, or a combination thereof. Alternatively, each of the first connecting portion 145*a*, the second connecting portion 145*b*, the third connecting portion 151, and the fourth connecting portion 152 may be formed of a conductive polymer. The third wafer 150 and the ultrasonic transducer wafer 148 may be bonded on wafer-level. For example, the third wafer 150 and the ultrasonic transducer wafer 148 may be bonded to each other by using eutectic bonding or polymer bonding. The eutectic bonding may be performed by bonding Au and Sn or Ag, Sn, and Cu. In this case, the first connecting portion 145*a* and the third connecting portion 151 may be bonded to each other, and the second connecting portion 145*b* and the fourth connecting portion 152 may be bonded to each other. The eutectic bonding which is a method of boding a metal to a metal by heating and compressing the metals at a eutectic temperature and solidifying the metals at a temperature lower than the eutectic temperature to form a bonded layer is regarded as a very robust and highly reliable bonding method.

Figure 3F:
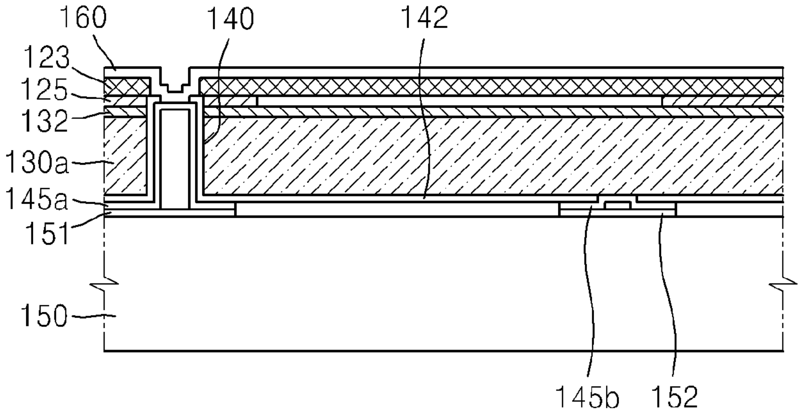

Referring to FIGS. 3E and 3F, if the first wafer 101 is a thin film, the first wafer 101 may be vibrated. For example, if the first wafer 101 is an SOI wafer, the first wafer 101 may be formed as a thin film by removing the first silicon wafer 110 and the insulating layer 121 of FIG. 3E to arrive at the structure shown in FIG. 3F. The first connecting portion 145*a* disposed along the via-hole 140 may be exposed by performing patterning. Next, as shown in FIG. 3F, an electrode layer 160 may be deposited on the second silicon wafer 123. When the electrode layer 160 is deposited on the second silicon wafer 123, the first connecting portion 145*a* and the electrode layer 160 may contact each other.

An ultrasonic transducer may be formed by slicing an ultrasonic transducer structure illustrated in FIG. 3F in units of chips. In other words, FIGS. 3A to 3F show only one chip. However, an ultrasonic transducer structure having many chips is formed using a wafer on wafer basis according to the process discussed above with reference to FIGS. 3A to 3F, and the wafer structure is then sliced in order to produce individual ultrasonic transducers. Since the ultrasonic transducer wafer 101 and the third wafer 150 including the driving circuit are bonded to each other in a wafer-to-wafer manner, the method of FIGS. 3A through 3F may be simper than a related art method in which bonding is performed individually in units of chips. For example, a related art method in which bonding is performed individually in units of chips requires a through-silicon via (TSV) wafer in order to maintain mechanical strength and smoothly transmit and receive an electrical signal, and the related art method bonds an ultrasonic transducer chip including the TSV wafer to a driving circuit chip by using flip-chip bonding. However, since the TSV wafer and the flip-chip bonding are not necessary in the method of FIGS. 3A through 3F, the method of FIGS. 3A through 3F may be simplified, thereby reducing manufacturing costs and improving yield.

While the present embodiment has been particularly shown and described with reference to exemplary embodiments thereof using specific terms, the embodiments and terms have been used to explain the present inventive concept and should not be construed as limiting the scope of the present inventive concept defined by the claims. The exemplary embodiments should be considered in a descriptive sense only and not for purposes of limitation. Therefore, the scope of the present inventive concept is defined not by the detailed description but by the appended claims, and all differences within the scope will be construed as being included in the present inventive concept.

What is claimed is:

1. An ultrasonic transducer comprising:

a first substrate that comprises a driving circuit;

a first insulating layer that is disposed on the first substrate;

a second substrate that is disposed on the first insulating layer and has a via-hole therein;

a support portion that is disposed above and spaced apart from the second substrate;

a thin film that is supported by the support portion and is spaced apart from the second substrate; and a cavity between the second substrate and the thin film, wherein the first substrate and the second substrate are directly bonded to each other with the first insulating layer therebetween.

2. The ultrasonic transducer of claim 1, wherein the first substrate is an application-specific integrated circuit substrate.

3. The ultrasonic transducer of claim 1, wherein the second substrate is a low-resistivity silicon substrate.

4. The ultrasonic transducer of claim 1, wherein the third substrate is a silicon substrate.

5. The ultrasonic transducer of claim 1, wherein the first substrate and the second substrate are bonded to each other by using eutectic bonding or polymer bonding.

6. The ultrasonic transducer of claim 1, wherein each of the first substrate and the second substrate comprises a plurality of connecting portions, and each of the connecting portions is formed of at least one material selected from the group consisting of gold (Au), copper (Cu), stannum (SN), silver (Ag), aluminum (Al), platinum (Pt), titanium (Ti), nickel (Ni), and chromium (Cr).

* * * * *